United States Patent [19]

Saigo et al.

[11] Patent Number: 5,117,191

[45] Date of Patent: May 26, 1992

[54] APPARATUS FOR MONITORING DEGRADATION OF INSULATION OF ELECTRICAL INSTALLATION

[75] Inventors: Akira Saigo, Kimitsu; Shigenari Maezawa, Chiyoda; Tomoaki Kageyama, Kuga; Akio Sera, Kuga; Fukuso Terunaga, Kuga, all of Japan

[73] Assignee: Mitsui Petrochemical Industries, Ltd., Tokyo, Japan

[21] Appl. No.: 560,722

[22] Filed: Jul. 31, 1990

[30] Foreign Application Priority Data

Jul. 31, 1989 [JP] Japan .................. 1-198556

[51] Int. Cl.$^5$ ............................................. G01R 31/02
[52] U.S. Cl. .................................. 324/551; 324/544; 324/529; 324/541
[58] Field of Search ............... 324/521, 522, 529, 536, 324/541, 544, 551; 333/177, 25, 32

[56] References Cited

U.S. PATENT DOCUMENTS

| 4,112,354 | 9/1978 | Bahder et al. ............. | 324/544 |
| 4,266,183 | 5/1981 | Steensma et al. ........... | 324/521 |
| 4,929,903 | 5/1990 | Saigo et al. ............... | 324/536 |

FOREIGN PATENT DOCUMENTS 223575  9/1988  Japan ................... 324/521

Primary Examiner—Kenneth A. Wieder
Assistant Examiner—Maura K. Regan
Attorney, Agent, or Firm—Sherman and Shalloway

[57] ABSTRACT

According to the invention, there is provided an apparatus for monitoring degradation of insulation of an electrical installation that can constantly monitor its electric equipments and cables for degradation of insulation under hot-line conditions. Said apparatus comprises:

a first sensor for detecting a progressive wave generated by a partial discharge taking place at a location where the insulation is degraded in the power transmission paths;

a second sensor for detecting the phase of said generated progressive wave as well as external noise;

a third sensor for detecting a reference signal for determining the direction of said progressive wave; and a measurement section for processing the signals from the first sensor, second sensor and third sensor;

wherein said measurement section determines existence or non-existence of degraded insulation by comparing the phases of the signals from the first sensor and the third sensor when it detects a progressive wave generated at a location where degradation of insulation of an electric cable or an electric equipment is taking place, and it also determines if the signal from each of the second sensor represents an external noise or degraded insulation and detects the phase of degradation if degraded insulation is involved.

11 Claims, 10 Drawing Sheets

APPARATUS FOR MONITORING DEGRADATION OF INSULATION OF ELECTRICAL INSTALLATION

BACKGROUND OF THE INVENTION

This invention relates to an apparatus for monitoring degradation of insulation of an electrical installation and more particularly it relates to an apparatus for monitoring degradation of insulation of an electrical installation that can identify one or more than one defectively insulated cables of a power transmission line or electrical equipments.

The insulation of a power cable and the equipment connected to thereto can become locally defective due to various causes.

While possible causes of faulty insulation include external mechanical forces, chemical changes of the insulator and so called water and/or electric trees, approximately eighty percent of serious insulation troubles are attributable to degraded insulation and therefore a variety of methods have been proposed for assessing the conditions of insulation of various items. A water tree mentioned above is a kind of deterioration of the insulator caused by water in an electric field, bringing about a destruction in the insulator that spreads like branches of a tree. An electric tree is also a kind of deterioration of the insulator which is caused to take place in a sectional high electric field in an inner part of the cable insulator or on a border surface between the semi-conductor layer and the insulator, wherein a sectional destruction occurs in the first place which is then spread like branches of a tree.

According to one of those proposed methods, the power supply system is periodically tested for the conditions of insulation thereof by temporarily suspending the power supply. In this method, the test may be conducted, for example, by applying DC voltage to the power line. What are measured here are: firstly, the partial discharge, secondly, the dielectric relaxation that can be assessed by the residual voltage, discharge current or residual charge, and, thirdly, the potential damping and leakage current that affect the performance of the insulator.

Alternatively, the test may be conducted by applying AC voltage to the power line. What are determined by this alternative test includes the partial discharge and the dielectric relaxation to be assessed by the dielectric tangent.

Apart from this, there is a method wherein a power supply system is examined under hot-line conditions by measuring the insulation resistance or the distributed DC current with a portable or stationary measuring instrument.

The above described method of assessment of the insulation performance of a power supply system involving periodical suspension of power supply, however, is very time consuming because all the power lines constituting the system have to be examined one after another. Moreover, the number of spots to be tested during an interruption of power supply will be limited. All these circumstances hinder thorough examination of the insulation of a power supply system for determining potential faults and consequently introduction of any preventive measures.

On the other hand, the method of examining a power supply system under hot-line conditions with a portable measuring instrument is accompanied by a problem of requiring skilled engineers for carrying out the examination as it involves sophisticated operation of insulating the neutral point of the grounding type transformer for the portable instrument from the earth for direct current. The operation is labor intensive and requires elaboration on the side of engineers for safety purposes. Besides, the insulation of the power supply system cannot be monitored on continuous basis.

When a stationary measuring instrument is used for this method of examining a power supply system under hot-line conditions, the grounding point of the cable shield needs to be insulated from the ground for direct current and therefore the insulation of the power supply system cannot be monitored on continuous basis either.

Moreover, the above described methods for examining and detecting degraded insulators of a power supply system under hot-line conditions are applicable only to high voltage cables and cannot detect local problems such as void discharge in an insulator.

SUMMARY OF THE INVENTION

Accordingly, it is the object of the present invention to provide an apparatus for monitoring degradation of insulation of an electrical installation that can constantly monitor power transmission cables and electric equipments in or related to that installation under hot-line conditions.

An apparatus according to the invention effectively solves the above described technological problems of existing apparatuses and can be used for a power transmission system having one or more than one power transmission paths as it comprises:

- a first sensor (S) for detecting a progressive wave generated by a partial discharge taking place at a location where the insulation is degraded in the power transmission paths:
- a second sensor (SR) for detecting the phase of said generated progressive wave as well as external noise:
- a third sensor (SF or SG) for detecting a reference signal for determining the direction of said progressive wave; and
- a measurement section (3) for processing the signals from said first sensor (S), second sensor (SR) and third sensor (SF or SG);
- wherein said measurement section (3) determines existence or not-existence of degraded insulation by comparing the phases of the signals from the first sensor (S) and the third sensor (SF or SG) when it detects a progressive wave generated at a location where degradation of insulation of a power cable (L) or an electric equipment is taking place, and it also determines if the signal from the second sensor (R) represents an external noise or degraded insulation and detects the phase of degradation if degraded insulation is involved.

Preferably, capacitors (CT or C) are arranged between the common buses connected with said power cable (L) and the ground for each phase of the buses, said first sensors (S), second sensor (SR) and third sensor (SF or SG) being respectively responsible in terms of detecting operation for the power cable (L) comprising a plurality of power transmission paths, each of the lines connecting the capacitors (CT or C) to the ground for each phase and the lines connecting all the capacitors (CT or C) to the ground.

The first sensor (S) is prepared by arranging a detection winding around an annular core and passing the power cable (L) which is provided with a plurality of power transmission paths through the annular core so that the power cable (L) constitutes the primary winding of the sensor.

The second sensor (SR) is similarly formed by arranging a detection winding around an annular core and passing all the electric wires that connect the capacitors (CT or C) and the ground through the annular core so that the wires constitute the primary windings of the sensor.

Finally, the third sensor (SF or SG) is also realized by arranging a detection winding around an annular core and passing all the electric wires that connect a capacitor (CT or C) and the ground through the annular core so that the wires constitute the primary windings of the sensor.

When measurement section (3) determines that a signal from the second sensor (SR) represents an external noise, the apparatus neglects any further processing required for degraded insulation due to a progressive wave or, if it ever have proceeded with the processing, cancels the useless processing operation.

Preferably, the first sensor (S), second sensor (SR) and third sensor (SF or SG) has approximately linear BH characteristics representing a proportional relationship between the magnetomotive force and the magnetic flux density and is prepared by arranging a detection winding around an annular core (K) having roughly a constant magnetic permeability over the entire frequency range from low to high regions. Said core is preferably made of an amosphous metal, especially made of amorphous metal containing cobalt as its principal ingredient, although a core made of a silicon steel with a high magnetic permeability and linear hysteresis characteristics or a core containing a magnetic material such as Permalloy or ferrite may be also feasible.

Each of the cores (K) may be realized as a single piece or by combining a pair of cut cores which become annular when assembled. The first sensor having a configuration as described above can be fitted directly onto the cable under hot-line conditions.

The first sensor (S) may be provided with the function of a zero-phase current transformer that can detect the earth current having a commercial frequency.

The first sensor (S), second sensor (SR) and third sensor (SF or SG) is formed by arranging a first winding (M1) which is short-circuited at both ends and a second winding (M2), of which the second winding (M2) serves as detection winding.

Alternatively, the first sensor (S), second sensor (SR) and third sensor (SF or SG) may be realized by simply adding impedance Z to the second winding (M2) without using the first winding (M1).

Each of said capacitors (CT or C) may be made of a dielectric ceramic material and have the form of an epoxy resin molded insulator, wherein a plurality of capacitor elements of dielectric ceramic are serially connected. When the capacitors (CT or C) are realized in the form of an epoxy resin molded insulator to provide mechanical as well as electric strength, they can serve as so many insulating supports for the buses and other electric wires.

Alternatively, each of said capacitors (CT or C) may be contained in an insulating sleeve made of a plastic material and provided with a high-voltage side contact and a grounding lead so that it may be connected directly to the buses under hot-line conditions.

Said dielectric ceramic material may be $SrTiO_3$ or $MgTiO_3$ or $BaTiO_3$.

When the insulation of a power transmission path becomes locally defective, a partial discharge of electricity occurs at that location.

This discharge then gives rise to a progressive wave that proceeds from the point of malfunction in opposite directions along the path. Therefore, the specific transmission path that has lost part of its insulation can be identified by detecting the direction of the travel of the progressive wave.

Further, it is possible to locate the point at which the malfunction has taken place by sensing the direction of said traveling progressive wave. This is made possible by comparing the phase of the progressive wave at a specific point, or reference point, on a common bus with the phase of the wave in each of the power transmission paths branching off from the common bus.

The accuracy with which the operation of determining degradation of insulation is conducted can be improved by utilizing the phenomenon that the electric characteristics of external noise (common mode noise) conspicuously differ from those of degraded insulation for any phases.

This technique will now be explained by referring to FIGS. 1 and 2 of the accompanying drawings. First, the progressive wave generated by the deteriorated insulation at point P travels through the first sensor (S). Assuming that the direction of the progressive wave traveling through the third sensor (SF) in the vicinity of the capacitors (C or CT) disposed in a first common bus (LF) is selected as the directional reference, it will be appreciated that only the first sensor (S1) of cable (L1) of all the cables (L) having a deteriorated insulation detects the progressive wave traveling in a direction opposite to the directional reference or the direction of travel of the progressive wave detected by the sensors (S) of all the other cables.

Similarly, assuming that the direction of travel of the progressive wave passing through the third sensor (SG) located between a second common bus (LG) and the ground GND is selected as the direction reference, only the sensor (S4) of cable (L1) of all the cables (L) having a deteriorated insulation detects the progressive wave traveling in a direction opposite to the direction reference or the direction of travel of the progressive wave detected by the sensors (S) of all the other cables.

When, for instance, three second sensors (SR) each having a wire {LF, (R, S, T)} connecting a capacitor (CT) and the ground as first winding are arranged in parallel as illustrated in FIG. 2 for comparing the phases of the currents passing through the wires, such an arrangement will facilitate the operation of determining if a signal above a given level represents common mode noise or deteriorated insulation as well as that of detecting the phase of the deteriorated insulation.

Now consequently, it is possible to locate the spot where the deterioration of insulation originates by assessing the signal detected by the first, second and third sensors.

As shown in FIG. 3(A), the cable (L), from which signals are detected and through which both a low frequency current and a high frequency current run, is wound around an annular core K to generate magnetomotive force in the core K.

Since the first and second windings (M1) and (M2) act as a secondary coil with respect to the cable L (primary coil), electromotive force is generated in the first winding (M1) as function of the magnetomotive force in the primary coil (cable L). However, since the both ends of the first winding (M1) are short-circuited, a current that cancels the change in the magnetic flux passing through the annular core K flows through the first winding (M1). It should be noted if the annular core K has a high magnetic permeability which remains constant over the entire frequency range from low to high regions and if its residual magnetism and coercive forces are both small and it has roughly linear BH characteristics, i.e., its magnetomotive force and magnetic flux density are roughly proportional to each other, then the inductive reactance of the first winding (M1) will be low for low frequency waves and high for high frequency waves.

As a result, only the high frequency components will be obtained from the second windings M2 as the low frequency components are practically completely canceled.

In practice, the line (L) and the core (X) may be set up by simply pulling the former into the latter as illustrated in FIG. 3(B).

Alternatively, the first winding (M1) may be omitted by adding impedance (Z) to the second winding (M2) and selecting appropriate frequency characteristics for the impedance (Z).

Now the invention will be described in greater detail by referring to the accompanying drawings that illustrate preferred embodiments of the invention.

BRIEF DESCRIPTION OF THE DRAWING

Of FIGS. 1 through 13(c) illustrating embodiments of the invention.

DETAILED DESCRIPTION OF THE INVENTION

In the accompanying drawings, 1 denotes a substation, 2 a power consumption site and 3 a measurement section, each of Ss (S1, S2, S3, S4, S5, S6, S21, S22, S23, S32 and S33) a first sensor, each of SF and SG a third sensor, SR a second sensor, M1 a first winding, M2 a second winding, K a core, each of C and CT a capacitor, P a point of deteriorated insulation, each of Ls (L1, L2, L3, L4, L5, L6, L21, L22, L23, L32 and L33) a cable, each of T1, T2 and T3 a transformer, M an electric motor and each of B1, B2, B3, B4, B5, B6, B7, B21 and B31 a breaker.

Figure 12:
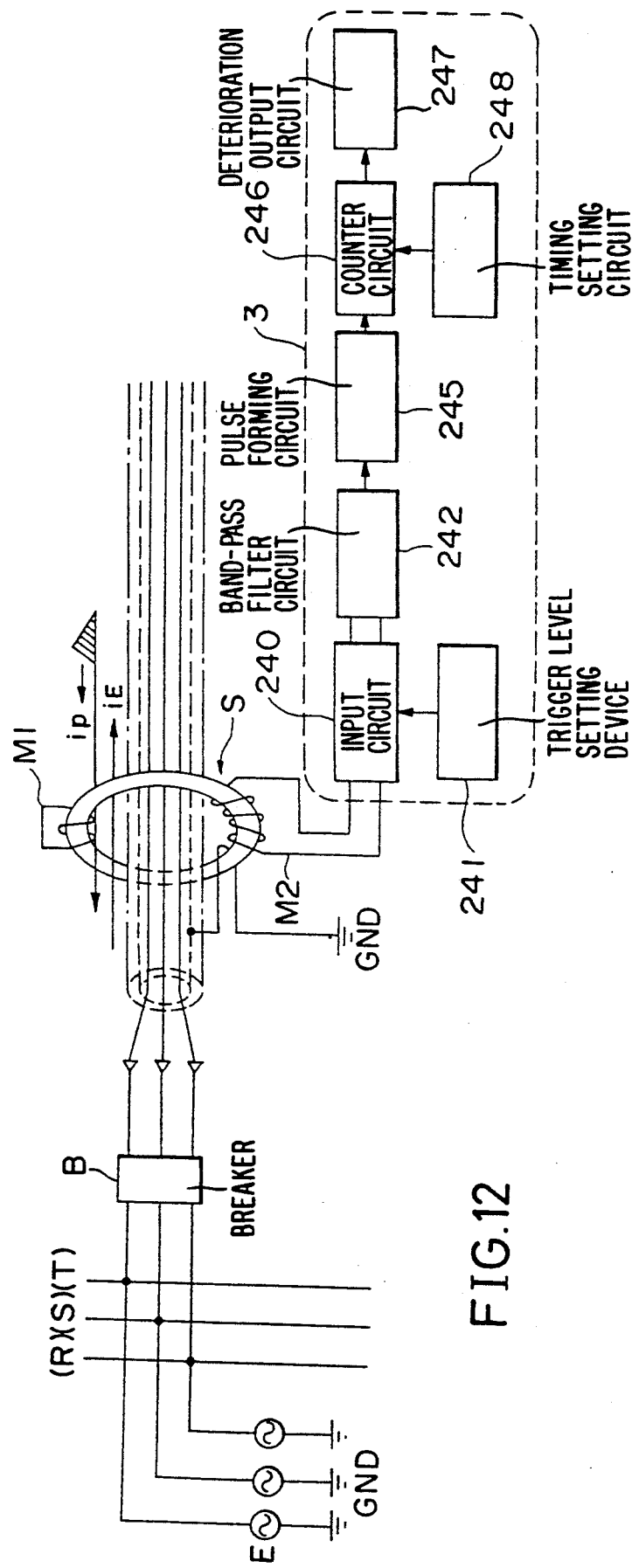
FIG. 12 is a circuit diagram showing in combination the sensors and the measurement sections of a second embodiment of the invention.

In FIG. 12, 240 denotes input circuit, 241 trigger level setting device, 242 filter circuit, 245 pulse forming circuit, 246 counter circuit, 247 output circuit for determining deteriorated insulation and 248 timing setting circuit.

Figure 13:
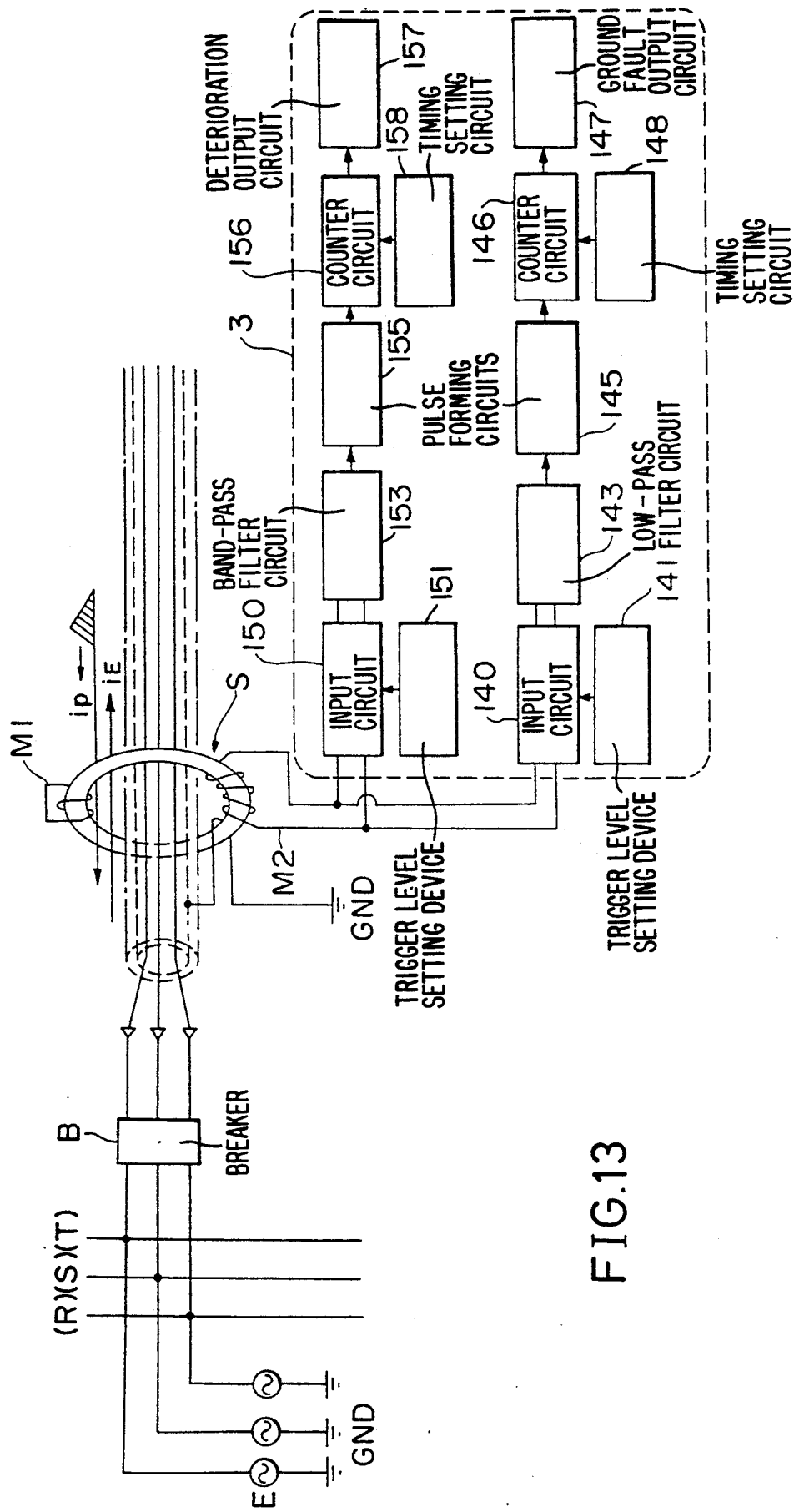
FIG. 13 is a circuit diagram similar to FIG. 12 but showing a third embodiment of the invention.

In FIG. 13, each of 140 and 150 denote input circuit, each of 141 and 151 trigger level setting device, each of 143 and 153 filter circuit, each of 145 and 155 pulse forming circuit, each of 146 and 156 counter circuit, each of 147 and 157 output circuit for determining deteriorated insulation and each of 148 and 158 timing setting circuit.

To begin with, the applicant has verified that any deterioration of insulation of a power transmission path causes a partial discharge to occur in the area concerned and such a discharge gives rise to a progressive wave in the power transmission path.

Now an apparatus that utilizes said progressive wave for locating the area the deterioration of insulation took place will be described.

Figure 1:
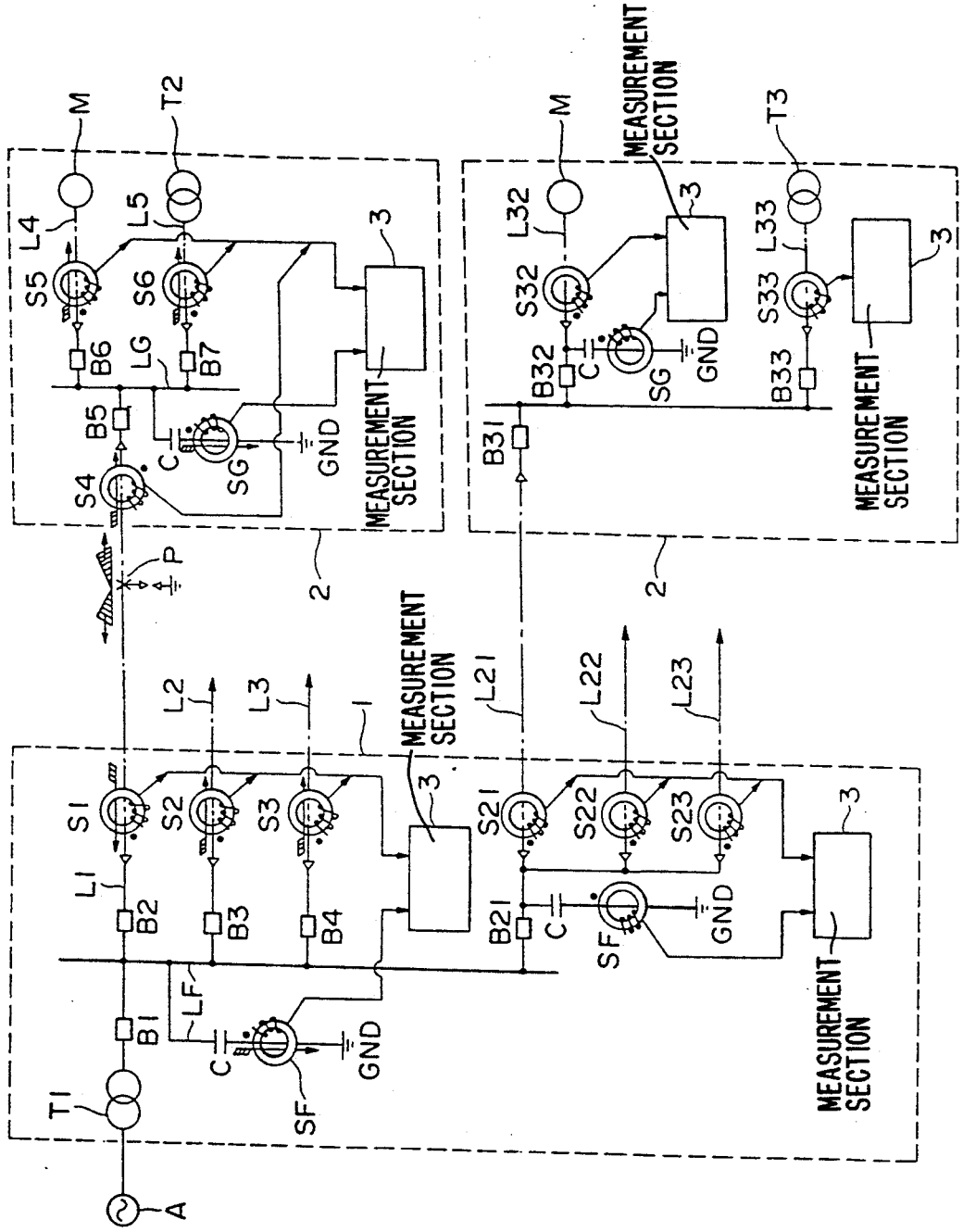
FIG. 1 is a block diagram of the embodiment.

Referring to FIG. 1, AC power is supplied to substation 1, where a transformer T1 and a breaker B1 are arranged in a transmission line to form a first common bus, which is connected to the ground (GND) through the intermediary of a capacitor C.

A third annular sensor SF is arranged between the capacitor C and the grounding section to surround the line and the output signal from the third sensor SF constitutes the signal of the reference point provided on the common bus.

Transmission cables L1, L2, L3, and L21, L22, and L23 are connected to said first common bus LF by way of circuit breakers B2, B3, B4 and B21 respectively. Annular sensors S1, S2, S3, S21, S22 and S23, are attached to these cables respectively in such a manner as to surround them.

Said cable L1 is extended to power consumption site 2.

The output signals from said first sensors S1, S2 and S3 as well as the output signal from the third sensor SF are sent to the measurement section 3 which is responsible for spotting deteriorated insulation.

At the power consumption site 2, the cable L1 is provided with a first sensor S4 and connected to a second common bus LG by way of a breaker B5.

Said second common bus LG is connected to the ground (GND) through a capacitor C. A third annular sensor SG is arranged between the capacitor C and the grounding section to surround the line and the output signal from the third sensor SG constitutes the signal of the reference point provided on the second common bus LG.

Transmission cables L4 and L5 are connected to said second common bus by way of circuit breakers B6 and B7 respectively. Annular sensors S5 and S6 are attached to these cables respectively in such a manner as to surround them.

Said cable L4 is connected to an electric motor M, while said cable L5 is connected to a transformer T2.

The output signals from said first sensors S4, S5 and S6 as well as the output signal from the third sensor SG are sent to the measurement section 3 provided at the power consumption site 2.

The progressive wave current brought forth by a partial discharge at the point of deteriorated insulation P is detected by the set of a first sensor S1, a third sensor SF and a measurement section 3 in the the substation 1 and also by the set of a first sensor S4, a third sensor SG and the measurement section 3 on the power consumption site 2.

Therefore, if the point of deteriorated insulation P is on the cable L1 as illustrated in FIG. 1, the fact is found by detecting the progressive wave current brought forth by a partial discharge at the point of deteriorated insulation P.

If, on the other hand, the point of deteriorated insulation P is within the electric motor M installed on the power consumption site 2, it is located by the set of a first sensor (S5), a third sensor (SG) and a measurement section 3 on the power consumption site 2.

In the smae manner, if the point of deteriorated insulation P is within the transformer T2, it is detected by the set of a first sensor S6, a third sensor SG and a measurement section 3 installed there.

Therefore, deteriorated insulation not only in any of the cables but also in any of the connected electric equipments can be detected with this arrangement.

The operational principle of said first sensor S and that of the circuits will not be explained.

Figure 3A:
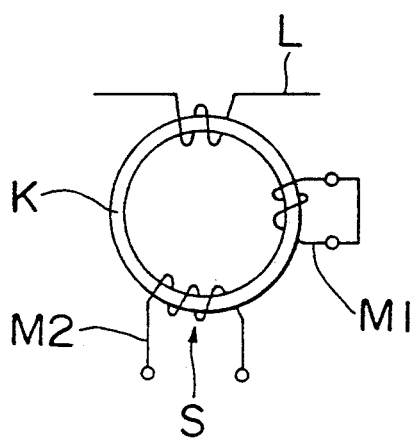
FIGS. 3(A) through 3(C) are front views of different sensors.
Figure 3B:
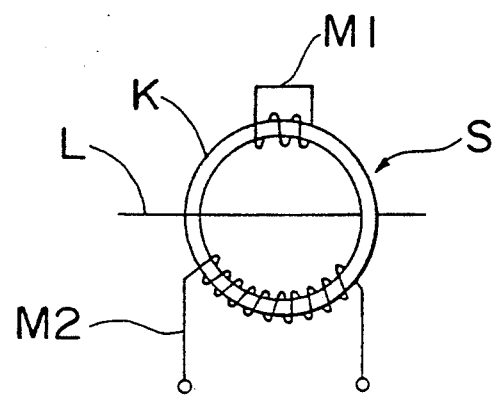
Figure 3C:
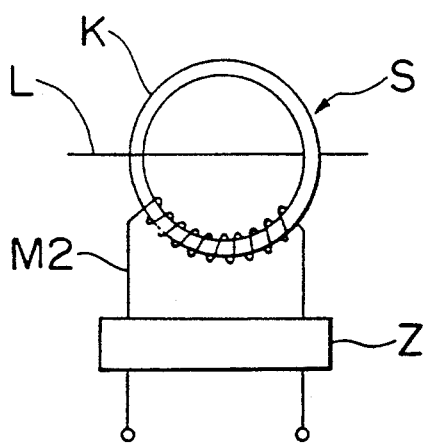
Figure 4:
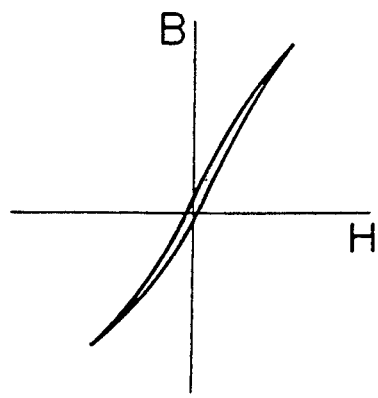
FIG. 4 is a graphic illustration of the BH characteristic of a sensor core.
Figure 5:
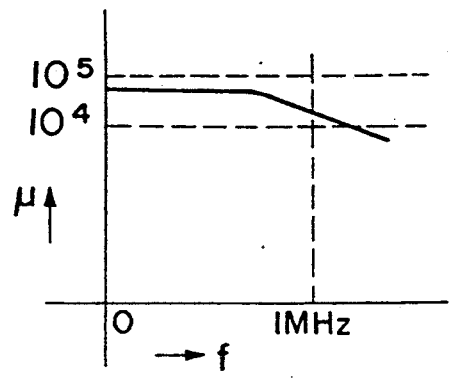
FIG. 5 is a graphic illustration of the frequency characteristics of the sensor core FIG. 4.

Said first sensor S comprises a core K and coils wound around the core K, which is made of a cobalt-based amorphous metal whose magnetic permeability is roughly constant over the entire frequency range from low to high frequency regions as illustrated in FIG. 5. Its residual magnetism and coercive force and are both small and it has almost linear BH characteristics as shown in FIG. 4. On this core K are wound a first winding M1 with short-circuited ends and a second winding M2 with open ends as shown in FIG. 3. The core K has a width of 10 mm, an inner diameter of 150 mm and a height of 5 mm. The number of turns is three for said first winding M1 and ten for said second winding M2.

With such a configuration, the sensor can discriminate a progressive wave generated by a partial discharge from a wave with the frequency of the power source and the low frequency current which is a higher harmonic thereof.

A first sensor S having a configuration as described above and having a core K made of a cobalt-based amorphous alloy would not show any magnetic saturation with an electric current of 2.5 ampere having a commercial frequency.

Figure 2:
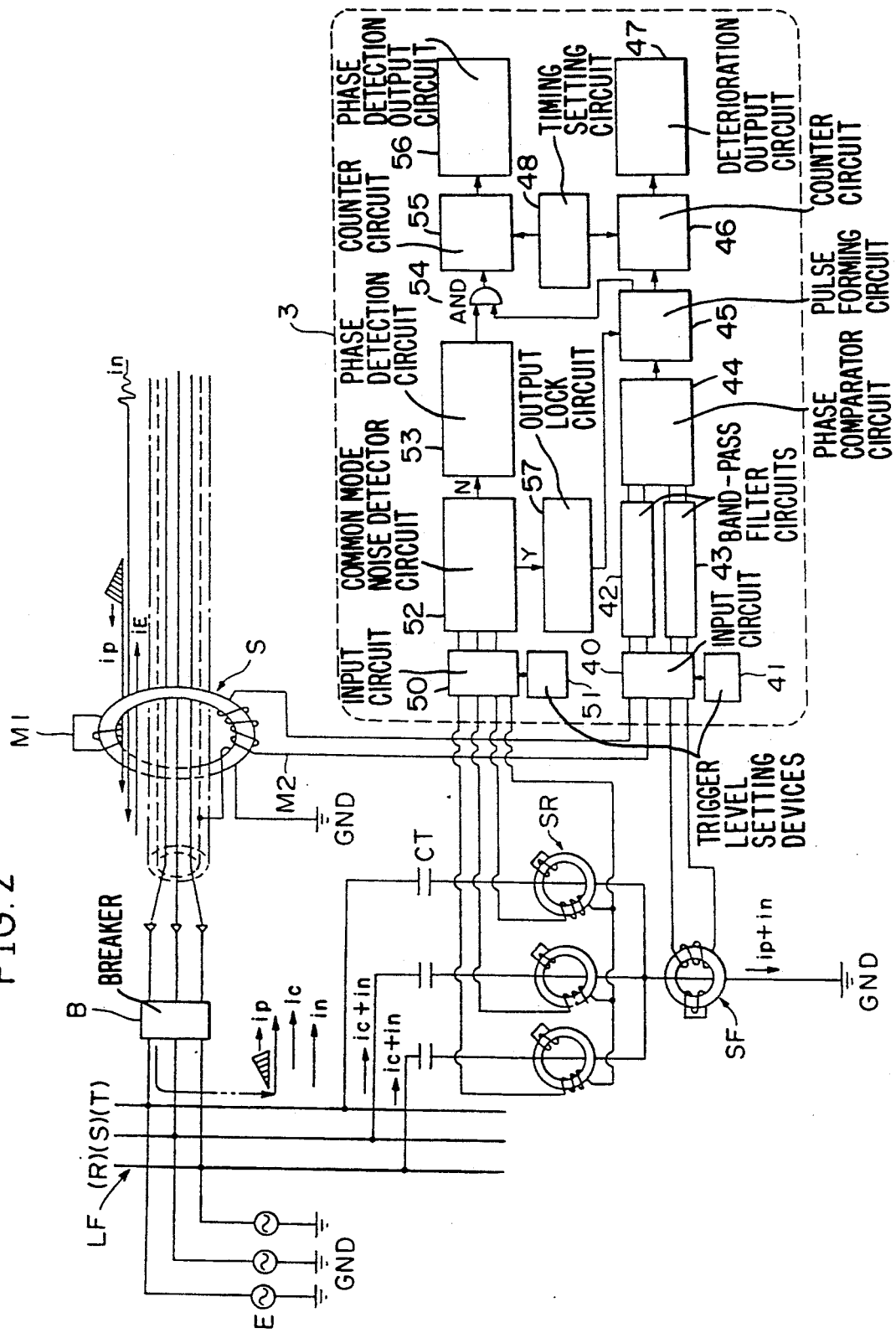
FIG. 2 is a circuit diagram showing in combination the sensors and the measurement section of the embodiment of FIG. 1.

FIG. 2 shows a first sensor having the above-mentioned configuration and applied to a power transmission line for three-phase current. Now, how a specific line with deteriorated insulation can be identified with such a sensor will be described.

The travel velocity of the progressive wave can be expressed as:

$$V = [(\text{magnetic permeability} \times \text{dielectric constant})^{\frac{1}{2}}]^{-1}$$

When a partial discharge is generated in the inside of insulator of a polyethylene cable, the progressive wave current brought forth by the partial discharge transmits through the conductor and the shield in the cable.

Since the dielectric constant of a polyethylene is four times as large as that of air, the propagation velocity of the progressive wave in the transmission line is about one half of the velocity of light or V is approximately 150 m/us. On the other hand, when a partial discharge is generated in an equipment, the progressive wave travels by way of the cable conductor and the earth, making its propagation velocity close to the velocity of light.

A progressive wave passing through the core of a sensor at such a high speed gives rise to a sharp magnetomotive force, which is a net result of a low frequency zero-phase current iE having the frequency of the power source and its higher harmonics and a progressive wave current iP caused to flow by said partial discharge. The inductive reaction of the first winding M1 is low to a low frequency and high to a pulse. Consequently, while any changes in the magnetic flux due to the magnetomotive force of the low frequency current iE can be almost completely nullified, those due to the magnetomotive force caused by the passage of the progressive wave current iP remains uncanceled.

Figure 8:
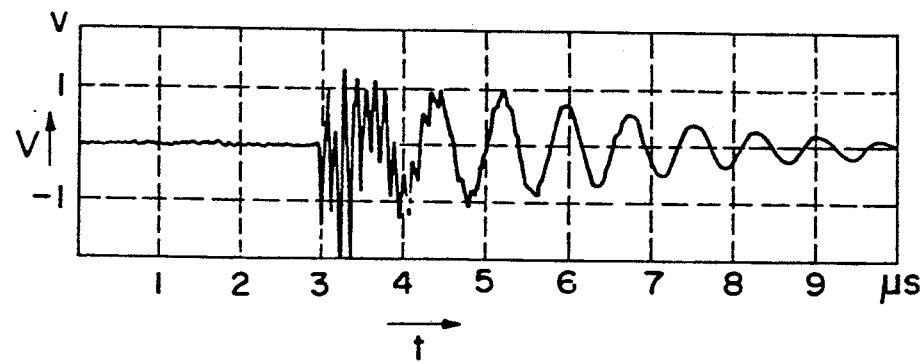
FIG. 8 is a graphic illustration showing how a progressive wave is detected when deteriorated insulation is involved in an electric motor.
Figure 9:
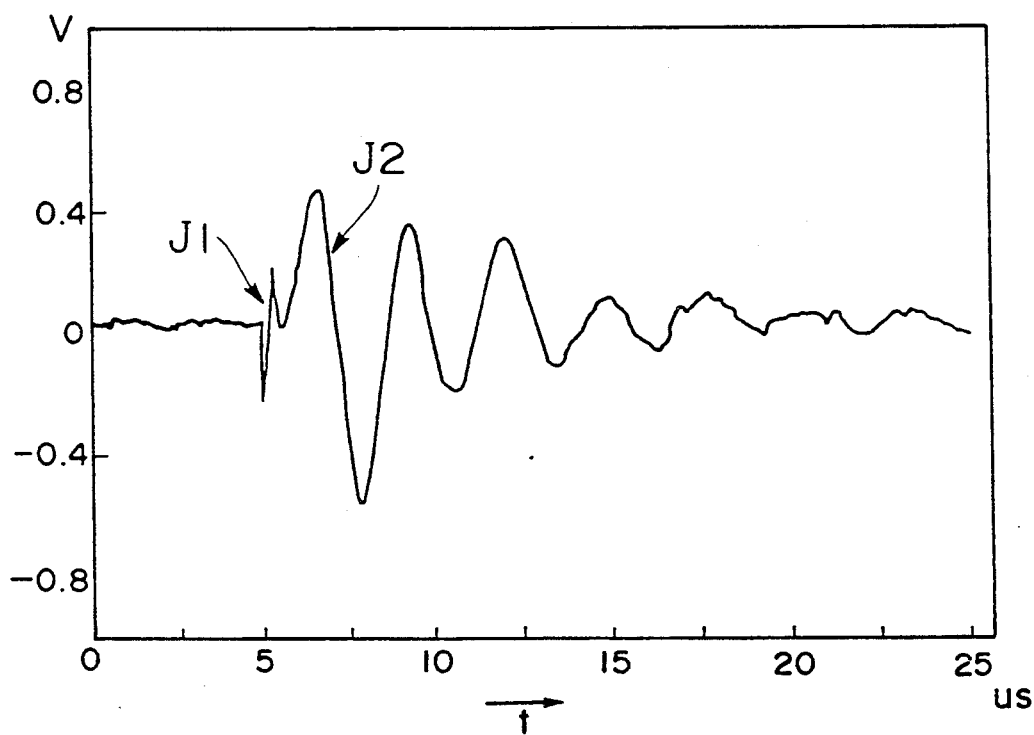
FIG. 9 is a graphic illustration showing the result of a measurement.

As a result, only the signal caused by the passage of the progressive wave current is detected at the terminals of the second windings M2. The obtained voltage detection signal will be in the form of an alternate damped oscillation as illustrated in FIGS. 7, 8 and 9.

Figure 7:
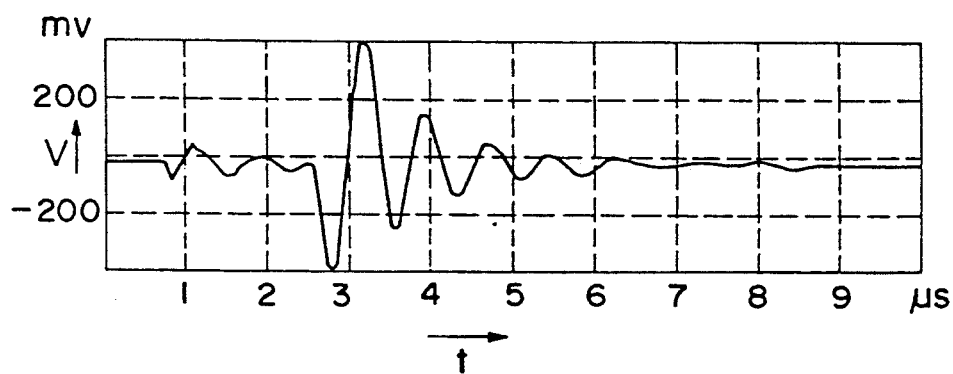
FIG. 7 is a graphic illustration showing how a progressive wave is detected when deteriorated insulation is involved in a cable.

FIG. 7 shows a progressive wave current caused to flow by a partial discharge in the insulation of a cable and detected by a first sensor S. The current does not have higher harmonics. FIG. 8 shows a progressive wave current caused to flow by a partial discharge in the insulation of a winding of an electric motor and detected by a sensor S. Here, the current contains a large higher harmonics at the top of the detected wave.

Since the cable conductor and the ground provide a transmission path of a progressive wave when a partial discharge is taking place in an electric equipment as described earlier, a large surge impedance and a high transmission velocity of the progressive wave will result, evidencing a higher harmonics at the top of wave.

It will be clear by now that by observing the top of the waveform sensed by a first sensor, it is possible to determine if degradation of insulation is in a cable or in an electric equipment such as an electric motor.

It is also possible to know through which phase of the capacitor CT the progressive wave travels by means of a second sensor SR for determining the phase of deterioration provided for each phase and obtain a deteriorated phase identification signal that tells which phase the progressive wave is passing through. Furthermore, it is possible to obtain by means of a third sensor SF disposed on a common line of the capacitor CT a signal that serves as a reference for the traveling direction of the progressive wave because the progressive wave passes through the sensor in a same direction no matter any phase or any part of the system may have been deteriorated.

In some systems, a high frequency common mode noise current can run through a first sensor S and second sensors SR each arranged for each of the phases of the bus as illustrated in FIG. 2. In such a case, while the common mode noise current in passes through the second sensors SR with a same phase regardless of the phases of the sensors, the progressive wave current ip caused by a partial discharge due to deteriorated insulation in the system passes through the second sensors with phases which are different from each other, making discrimination of the two currents as well as elimination of adverse effects of the noise current impossible.

Figure 6:
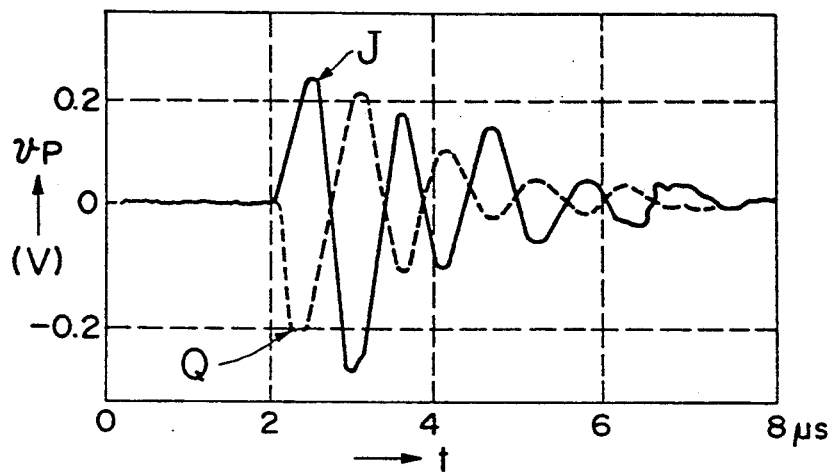
FIG. 6 is a graphic illustration showing the result of detection of a progressive wave.

Now, the result of an experiment on detection of a progressive wave will be described by referring to FIG. 6. A circuit as illustrated in FIG. 2 was used in this experiment to detect a progressive wave generated by a partial discharge due to deterioration of the insulator of a cable. In the graph of FIG. 6, J denotes the signal characteristic curve of the first sensor S and Q denotes that of the third sensor (SF or SG). If there is some insulation defect in the cable, the progressive wave travels in both directions through the cable, the direction of the progressive wave current passing through the first sensor S and that of the progressive wave current passing through the third sensor being opposite to each other, the phase of J being roughly reversed from that of Q. Therefore, the existence of a progressive wave and hence a defect in the cable can be determined by checking the J and Q.

The measurement section 3 as illustrated in FIG. 2 operates in the following manner under insulated condition. Signals from the detection coils of the first sensor S, the second sensor SR for different phases and the third sensor SF are entered into the measurement section 3 under insulated condition.

In the measurement section 3, the detection signals of the first sensor S and the third sensor SR are introduced into input circuit 40 and only the frequency bands of those signals having values that exceed a given value set by trigger level setting device 41 are allowed to pass through filter circuits 42, 43 and fed to a phase comparator circuit 44.

The phase comparator circuit 44 compares the phase of the signal from the first sensor S of the cable with that of the signal from the third sensor SF from the common bus and, if the comparison of the phases indicates that a progressive wave ip is traveling from the cable where the first sensor S is installed, a signal representing the situation is entered into a pulse forming circuit 45.

On the other hand, the detection signals from the second sensor SR for different phases are entered into input circuit 50 and only the signals having values that exceed a given value set by trigger level setting device 51 are allowed to enter a common mode noise detector circuit 52, which detemines the values and phases of the signals from the second sensors for different phases. If the signals are so determined that they represent a common mode noise current in, the output lock circuit 57 blocks the output path of the system and does not allow the output of said pulse forming circuit 45 to go out. Consequently, the system does not operate any further to locate the area of deteriorated insulation.

If the signals are so determined by the common mode noise detector circuit 52 that they represent degraded insulation due to a partial discharge, a phase detection circuit 53 for deteriorated insulation detects the phase of the deteriorated insulator from the levels of the signals transmitted from the second sensor SR for different phases.

The output of the pulse forming circuit 45 is entered into a counter circuit 46.

The counter circuit 46 sends a signal to output circuit 45 for determining deteriorated insulation whenever it has stored a count that exceeds a preset value within a repeat timing period set by a timing setting circuit 48 and the output circuit 45 for determining deteriorated insulation displays the result of the determining operation and sends out a signal representing the result.

Meanwhile, the output of the pulse forming circuit 45 and that of the phase detection circuit 53 for deteriorated insulation are entered into an AND gate 54, the output of which is then entered into another counter circuit 55.

When the count stored in said counter circuit 55 exceeds a preset value within the repeat timing period set by the timing setting circuit 48, the counter circuit 55 gives out a signal to another output circuit 56 for determining deteriorated insulation, which displays the result of the determining operation and sends out a signal representing the result.

Now, the measurement section 3 completes its operation and can identify the power transmission path with deteriorated insulation and determines the phase of deterioration.

Referring to FIG. 9 which illustrates a wave form obtained by an actual measurement operation, while a pulse generated by a partial discharge can be observed without any auxiliary devices, it takes place in a very short period of time and is often caught and observed with difficulty. Therefore, it is advisable to insert a resonance circuit within the pulse detection circuit and FIG. 9 shows a waveform obtained by using such a resonance circuit. In FIG. 9, J1 indicates a pulse generated by a partial discharge, said pulse by turn excites the resonance circuit to generate a damped waveform having a specific frequency.

It should be noted that the size and shape as well as the material of the core K are not limited to those of the above described embodiment and can be modified or altered depending on the conditions under which the detecting operation is carried out.

Figure 10A:
FIGS. 10(a) through (c) and 11(a) through (c) are plan views of different capacitors.
Figure 10B:
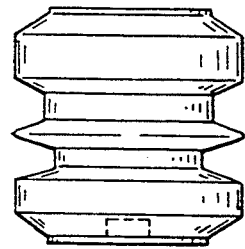
Figure 10C:
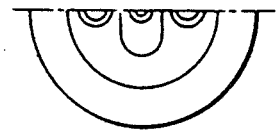
Figure 11A:
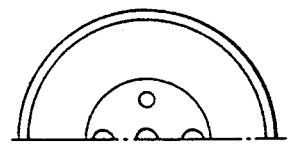
Figure 11B:
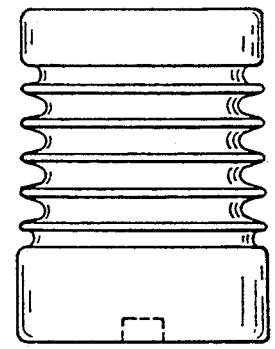
Figure 11C:
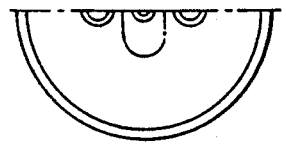

FIGS. 10 and 11 illustrate two different capacitors CT to be used for the purpose of the present invention. While the capacitor of FIG. 10 has a capacitance of 500 pF, that of the capacitor of FIG. 11 is 1,000 pF. The capacitor of FIG. 11 is so designed that it can be also used as an insulator for supporting a bus and therefore it can significantly reduce the space required for installation of the apparatus. Each of the capacitors are molded as an insulator by serially connecting a plurality of capacitor elements made of a dielectric ceramic material and covering the elements with an epoxy resin.

Capacitors to be used for the purpose of the present invention are needed to meet a variety of rigorous requirements including a high withstand voltage, excellent insulation properties, a long durability and other electrical and mechanical reliability requirements because they are installed in an existing power transmission facility as durable items and exposed to highly intruding progressive waves and the high initial voltage of partial discharges.

After a series of experiments conducted by the inventor of the present invention, it was found that capacitor elements for the purpose of the invention are preferably made of a dielectric ceramic material with a composition of $SrTiO_3$ or $MgTiO_3$ or $BaTiO_3$ in respect to properties of high intruding progressive wave and high voltage durability. Therefore, it is preferable in this invention to use a dielectric ceramic material with such composition.

Moreover, it was found that the capacitor elements arranged in series and moulded in an epoxy resin are suitable because of exhibiting high initial voltage of partial discharges, durability of high withstand voltage, and durability of excellent insulation properties as a result of an accerated deterioration test. So, it is preferable in this invention to use the capacitor elements arranged as above.

Now, other embodiments of the invention will be described by referring to FIGS. 12 through 15.

FIG. 12 shows a circuit diagram of an embodiment of the apparatus of the invention which is suitably used for a power transmission system where no noise is involved.

FIG. 13 is a circuit diagram of another embodiment which is suitably used for detecting a short-circuit to the ground beside for its proper mission of constantly monitoring a power transmission system for degradation of insulation. It is seen that since the conventional zero-phase current transformer is replaced by a first sensor in this embodiment and therefore no zero-phase current transformer nor grounding relay are used, the overall cost of the apparatus and the space required for installing it can be significantly reduced.

Figure 14:
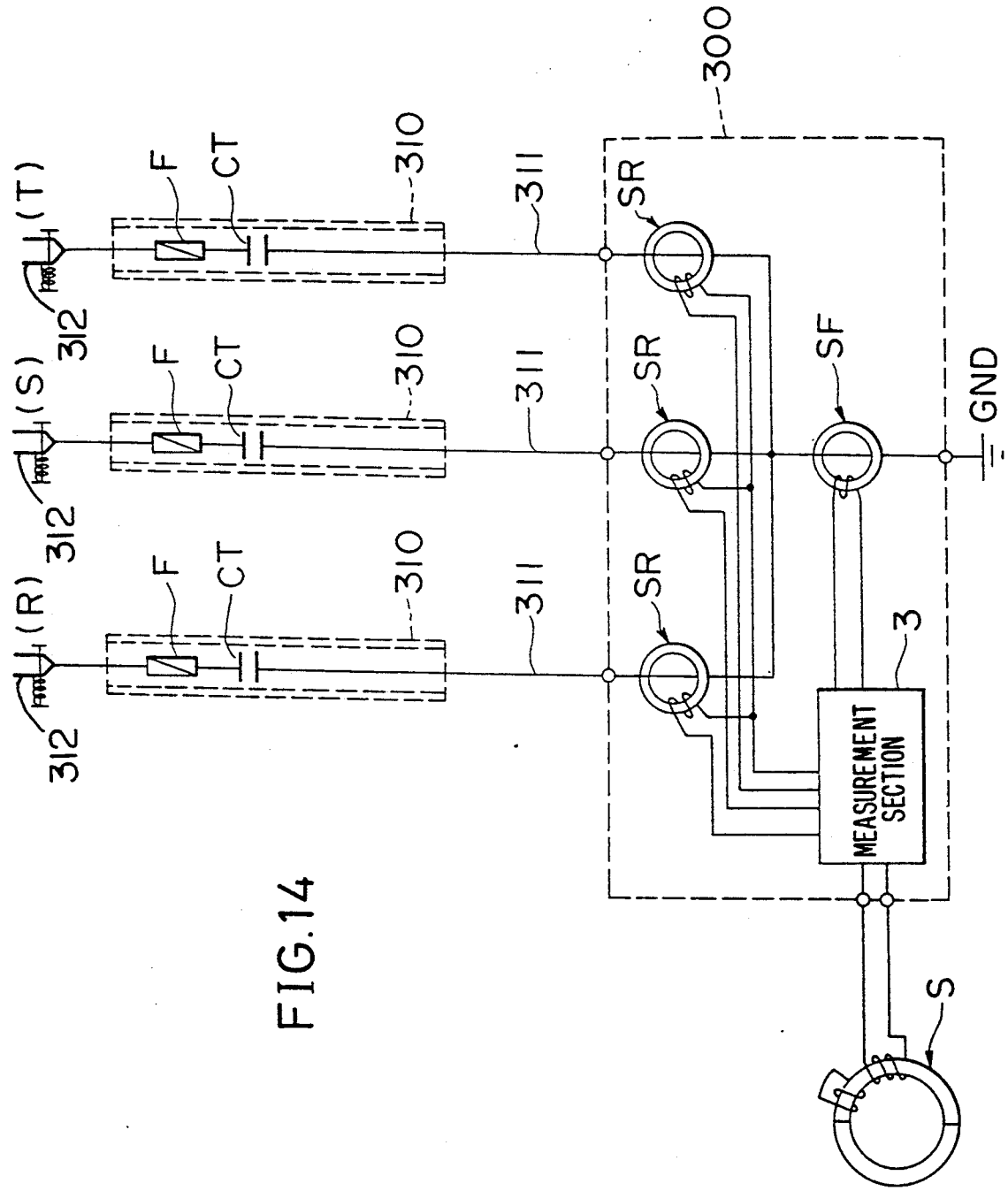
FIG. 14 is a circuit diagram of another embodiment of the invention realized in the form of a portable set.

FIG. 14 shows a circuit diagram of another embodiment which is designed to be a portable apparatus.

The first sensor S comprises a cut-type core and can be removably fitted onto power cable L.

Three wires 311 having removably fitted terminals 312 are respectively arranged for different phases of the bus which is connected to the power cable (L). Fuses F and capacitors CT are respectively connected with the wires 311. The capacitors CT are then respectively contained in insulating sleeves 310 and connected to a high voltage bus by way of the fuses (F) and terminals 312.

The grounding wire 311 of each of the capacitors CT is connected to the ground GND by way of a second sensor SR contained in a handy case 300 and a third sensor SF.

The handy case 300 also contains a measurement section 3 which receives output signals from the first sensor S, second sensors SR and third sensor SF.

Such a portable apparatus for monitoring degradation of insulation can be installed in and removed from an electrical facility under hot-line condition without requiring any interruption of service.

Figure 15:
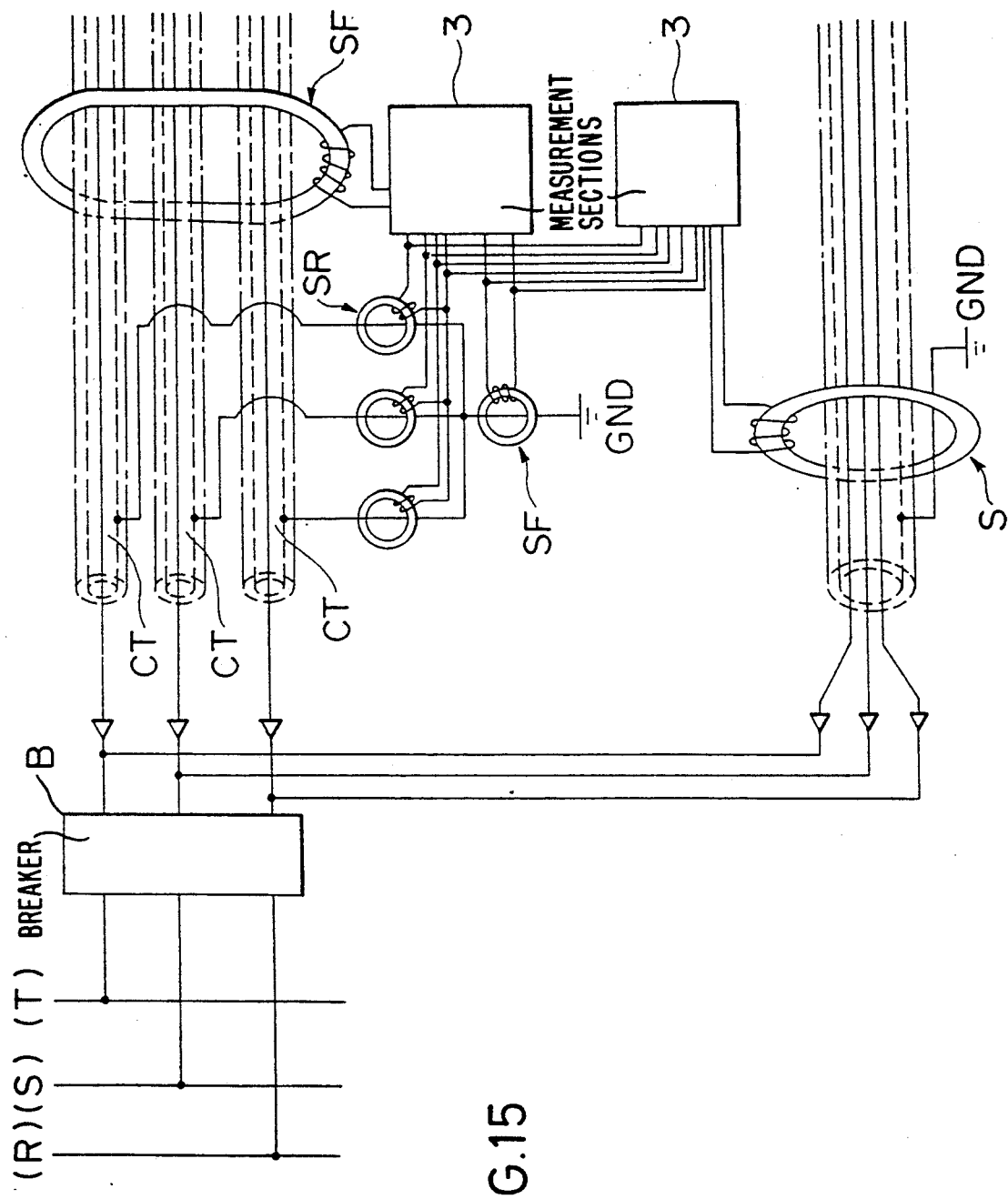
FIG. 15 is a circuit diagram of still another embodiment of the invention realized by utilizing as a capacitor the space between the cable core and the shield of cables that constitute so many hot-lines.

FIG. 15 shows a capacitor (C) obtained by utilizing the static capacity of the space between the cable core and the shield of a single core cable or a triplex cable.

Since such an arrangement does not require any ceramic capacitors arranged on the bus, it is particularly suitable for high voltage transmission lines above 10 KV.

As is apparent from the above description, an apparatus for monitoring degradation of insulation according to the invention can monitor an electrical facility comprising electric equipments and cables for insulation under hot-line conditions.

Moreover, such an apparatus can effectively and surely detect any deteriorated insulation and identify the area of deterioration without being affected by external noises.

Therefore an apparatus according to the invention can check slightest deterioration of insulation and prevent accidents due to such deterioration from taking place.

What is claimed is:

1. An apparatus for monitoring degradation of insulation of an electrical installation comprising:

a first sensor for detecting a progressive wave generated by a partial discharge taking place at a location where the insulation is degraded in the power transmission paths;

a second for detecting the phase of said generated progressive wave as well as external noise;

a third sensor for detecting a reference signal for determining the direction of said progressive wave; and a measurement section for processing the signals from said first sensor, second sensor and third sensor;

wherein said measurement section determines existence or non-existence of degraded insulation by comparing the phases of the signals from the first sensor and the third sensor when it detects a progressive wave generated at a location where degradation of insulation of an electric cable or an electric equipment is taking place, and it also determines if the signal from the second sensor represents an external noise or degraded insulation and detects the phase of degradation if degraded insulation is involved;

capacitors being arranged between common buses connected with a power cable and ground for each phase of the buses;

said first sensor being adapted to detect progressive waves in a power cable comprising a plurality of power transmission paths;

said second sensor being adapted to detect the phase of progressive waves in lines connecting the capacitors to the ground for each different phase;

said third sensor being adapted to detect a reference signal in lines connecting all the capacitors to the ground, each of said first, second and third sensors being formed by arranging a detection winding around an annular core and placing an object of detecting operation through the annular core, said object of detecting operation constituting its primary winding, said measurement section does not proceed with the operation of detecting degradation of insulation caused by a progressive wave once the signal from the second sensor is determined to represent external noise, and each of the annular cores of said first, second and third sensors showing roughly linear BH characteristics representing a roughly proportional relationship between its magnetomotive force and magnetic flux density and an almost constant magnetic permeability over the entire frequency range from low to high frequency regions.

2. An apparatus for monitoring degradation of insulation of an electrical installation according to claim 1, wherein said first sensor is provided with the function of a zero-phase current transformer for detecting grounding currents with a commercial frequency.

3. An apparatus for monitoring degradation of insulation of an electrical installation according to claim 1 wherein said cores are made of an amorphous metal.

4. An apparatus for monitoring degradation of insulation of an electrical installation according to claim 3, wherein said amorphous metal is an amorphous metal containing cobalt as its principal ingredient.

5. An apparatus for monitoring degradation of insulation of an electrical installation according to claim 1 wherein each of said first, second and third sensors are formed by arranging a first winding having short-circuited two ends and a second winding, said second winding being the detection winding.

6. An apparatus for monitoring degradation of insulation of an electrical installation according to claim 1, wherein said capacitors are made of a dielectric ceramic material.

7. An apparatus for monitoring degradation of insulation of an electrical installation according to claim 6, wherein said dielectric ceramic material has a composition of $SrTiO_3$ or $MgTiO_3$ and $BaTiO_3$.

8. An apparatus for monitoring degradation of insulation of an electrical installation according to claim 6, wherein each of said capacitors is realized in the form of an insulator having an excellent mechanical and electrical strength and serves as an insulator for supporting a bus or a wire.

9. An apparatus for monitoring degradation of insulation of an electrical installation according to claim 8, wherein each of said capacitors is formed by serially connecting a plurality of capacitor elements made of a dielectric ceramic material and covering them with an epoxy insulator.

10. An apparatus for monitoring degradation of insulation of an electrical installation according to claim 1, wherein each of said capacitors is realized by utilizing the electrostatic capacity of the space between the cable core of a bus and the shield covering the core.

11. An apparatus for monitoring degradation of insulation of an electrical installation according to claim 1, wherein the annular core of the first sensor is formed by assembling core halves that can be separately and removably fitted to a power cable constituting the object of detecting operation, a wire being arranged and provided with a removable terminal on a bus connected with said wire for each phase, said second and third sensors being provided on the grounding wires of said capacitors, said second and third sensors and said measurement section being contained in a case to form a portable apparatus.

* * * * *